(12) United States Patent
Whitney et al.

(10) Patent No.: US 7,034,652 B2
(45) Date of Patent: Apr. 25, 2006

(54) ELECTROSTATIC DISCHARGE MULTIFUNCTION RESISTOR

(75) Inventors: Stephen J. Whitney, Lake Zurich, IL (US); Hugh Hyatt, Bremerton, WA (US); Louis Rector, Allegany, NY (US)

(73) Assignee: Littelfuse, Inc., Des Plaines, IL (US)

( * ) Notice: Subject to any disclaimer, the term of this patent is extended or adjusted under 35 U.S.C. 154(b) by 0 days.

(21) Appl. No.: 10/192,034

(22) Filed: Jul. 10, 2002

(65) Prior Publication Data

US 2003/0025587 A1    Feb. 6, 2003

Related U.S. Application Data

(60) Provisional application No. 60/304,244, filed on Jul. 10, 2001.

(51) Int. Cl.
*H01C 8/00* (2006.01)

(52) U.S. Cl. .................. 338/223; 338/13; 338/216; 338/224; 338/225; 338/22 R; 338/22 SD

(58) Field of Classification Search ............ 338/20–21, 338/13, 14, 22 R, 22 SD, 25, 52, 54, 223–225, 338/216; 428/210
See application file for complete search history.

(56) References Cited

U.S. PATENT DOCUMENTS

| | | | |
|---|---|---|---|
| 2,273,704 A | 2/1942 | Grisdale | |
| 2,796,505 A | 6/1957 | Bocciarelli | |
| 3,500,276 A | 3/1970 | Hingorany et al. | |
| 3,619,725 A | 11/1971 | Mendham et al. | |
| 3,685,026 A | 8/1972 | Wakabayashi et al. | |
| 3,685,028 A | 8/1972 | Wakabayashi et al. | |
| 3,743,894 A | 7/1973 | Hall et al. | |
| 3,772,774 A | 11/1973 | Knippenberg et al. | |
| 3,821,686 A * | 6/1974 | Harnden, Jr. ................ 338/20 |
| 3,913,219 A | 10/1975 | Lichtblau | |
| 3,916,366 A | 10/1975 | Jefferson | |
| 3,936,700 A | 2/1976 | Reiter | |
| 3,983,527 A * | 9/1976 | Ohsato et al. ............... 338/35 |
| 4,045,712 A | 8/1977 | DeTommasi | |
| 4,157,527 A | 6/1979 | Philipp | |
| 4,164,725 A | 8/1979 | Wiebe | |
| 4,198,744 A | 4/1980 | Nicolay | |
| 4,252,692 A | 2/1981 | Taylor et al. | |

(Continued)

FOREIGN PATENT DOCUMENTS

CH    663 491    12/1987

(Continued)

OTHER PUBLICATIONS

Micrel Product Brochure, entitled: "MIC2505/2506 Single 2A/Dual 1A/High-Side Switches". (No date).
Unitrode Product Brochure; entitled: "UCC3912 Programmable Hot Swap Power Manager". (No date).

*Primary Examiner*—Tu Hoang
(74) *Attorney, Agent, or Firm*—Bell, Boyd & Lloyd LLC

(57) ABSTRACT

The present invention provides a multifunction resistor having an improved voltage variable material ("VVM"). More specifically, the present invention provides a polymer VVM that has been formulated with a high percentage loading of conductive and/or semiconductive particles. A known length of the relatively conductive VVM is placed between adjacent electrodes to produce a desired Ohmic normal state resistance. When an electrostatic discharge event occurs, the VVM of the multifunctional resistor becomes highly conductive and dissipates the ESD threat. One application for this "resistor" is the termination of a transmission line, which prevents unwanted reflections and distortion of high frequency signals.

29 Claims, 4 Drawing Sheets

U.S. PATENT DOCUMENTS

| | | | |
|---|---|---|---|
| 4,278,706 A | 7/1981 | Barry | |
| 4,280,221 A | 7/1981 | Chun et al. | |
| 4,302,659 A * | 11/1981 | Horiba et al. | 219/270 |
| 4,331,948 A | 5/1982 | Malinaric et al. | |
| 4,343,768 A * | 8/1982 | Kimura | 422/97 |
| 4,359,414 A | 11/1982 | Mastrangelo | |
| 4,370,640 A * | 1/1983 | Dynes et al. | 338/25 |
| 4,413,300 A | 11/1983 | Sumi et al. | |
| 4,503,415 A | 3/1985 | Rooney et al. | |
| 4,514,718 A | 4/1985 | Birx | |
| 4,533,896 A | 8/1985 | Belopolsky | |
| 4,540,969 A | 9/1985 | Sugar | |
| 4,547,830 A | 10/1985 | Yamauchi | |
| 4,554,732 A | 11/1985 | Sadlo et al. | |
| 4,559,579 A | 12/1985 | Val | |
| 4,612,529 A | 9/1986 | Gurevich et al. | |
| 4,626,818 A | 12/1986 | Hilgers | |
| 4,652,848 A | 3/1987 | Hundrieser | |
| 4,720,402 A | 1/1988 | Wojcik | |
| 4,726,991 A * | 2/1988 | Hyatt et al. | 338/20 |
| 4,771,260 A | 9/1988 | Gurevich | |
| 4,792,781 A | 12/1988 | Takahashi et al. | |
| 4,837,520 A | 6/1989 | Golke et al. | |
| 4,873,506 A | 10/1989 | Gurevich | |
| 4,928,199 A | 5/1990 | Diaz et al. | |
| 4,958,426 A | 9/1990 | Endo et al. | |
| 4,975,551 A | 12/1990 | Syvertson | |
| 4,977,357 A | 12/1990 | Shrier | |
| 4,992,333 A | 2/1991 | Hyatt | |
| 5,068,634 A * | 11/1991 | Shrier | 338/21 |
| 5,084,691 A | 1/1992 | Lester et al. | |
| 5,095,297 A | 3/1992 | Perreault et al. | |
| 5,097,246 A | 3/1992 | Cook et al. | |
| 5,097,247 A | 3/1992 | Doerrwaechter | |
| 5,099,380 A | 3/1992 | Childers et al. | |
| 5,102,506 A | 4/1992 | Tanielian | |
| 5,102,712 A | 4/1992 | Peirce et al. | |
| 5,115,220 A | 5/1992 | Suuronen et al. | |
| 5,140,295 A | 8/1992 | Vermot-gaud et al. | |
| 5,142,263 A | 8/1992 | Childers et al. | |
| 5,148,141 A | 9/1992 | Suuronen | |
| 5,152,930 A * | 10/1992 | Spiro et al. | 252/500 |
| 5,155,462 A | 10/1992 | Morrill, Jr. | |
| 5,159,300 A * | 10/1992 | Nakamura et al. | 338/21 |
| 5,166,656 A | 11/1992 | Badihi et al. | |
| 5,183,698 A | 2/1993 | Stephenson et al. | |
| 5,189,387 A | 2/1993 | Childers et al. | |
| 5,232,758 A | 8/1993 | Juskey et al. | |
| 5,246,388 A | 9/1993 | Collins et al. | |
| 5,248,517 A | 9/1993 | Shrier et al. | |
| 5,260,848 A * | 11/1993 | Childers | 361/127 |
| 5,262,754 A | 11/1993 | Collins | |
| 5,273,815 A | 12/1993 | Brydon et al. | |
| 5,278,535 A | 1/1994 | Xu et al. | |
| 5,290,821 A | 3/1994 | Sakurai et al. | |
| 5,294,374 A * | 3/1994 | Martinez et al. | 252/518 |
| 5,335,137 A | 8/1994 | English et al. | |
| 5,340,641 A | 8/1994 | Xu | |
| 5,340,775 A | 8/1994 | Carruthers et al. | |
| 5,345,212 A * | 9/1994 | Brown | 338/20 |
| 5,350,594 A | 9/1994 | Unruh | |
| 5,363,082 A | 11/1994 | Gurevich | |
| 5,374,590 A | 12/1994 | Batdorf et al. | |
| 5,379,022 A * | 1/1995 | Bacon et al. | 338/20 |
| 5,384,190 A | 1/1995 | Kaburaki | |
| 5,386,335 A * | 1/1995 | Amano et al. | 338/21 |
| 5,393,597 A | 2/1995 | Childers et al. | |
| 5,412,257 A * | 5/1995 | Cordoba et al. | 338/21 |
| 5,416,462 A * | 5/1995 | Demarmels et al. | 338/22 R |
| 5,438,166 A | 8/1995 | Carey et al. | |
| 5,448,095 A | 9/1995 | Hennessey et al. | |
| 5,476,714 A | 12/1995 | Hyatt | |
| 5,508,224 A | 4/1996 | Jang | |
| 5,510,947 A | 4/1996 | Pellegrini et al. | |
| 5,537,108 A | 7/1996 | Nathan et al. | |
| 5,545,910 A | 8/1996 | Jang | |
| 5,592,016 A | 1/1997 | Go et al. | |
| 5,594,204 A | 1/1997 | Taylor et al. | |
| 5,646,434 A | 7/1997 | Chrysostomides et al. | |
| 5,647,767 A | 7/1997 | Scheer et al. | |
| 5,669,381 A * | 9/1997 | Hyatt | 338/20 |
| 5,675,813 A | 10/1997 | Holmdahl | |
| 5,707,886 A | 1/1998 | Consiglio et al. | |
| 5,728,535 A * | 3/1998 | Lester et al. | 338/21 |
| 5,742,223 A * | 4/1998 | Simendinger, III et al. | 338/21 |
| 5,753,982 A | 5/1998 | Yeh | |
| 5,756,007 A | 5/1998 | Franey | |
| 5,777,368 A | 7/1998 | Wu et al. | |
| 5,781,395 A | 7/1998 | Hyatt | |
| 5,796,570 A | 8/1998 | Mekdhanasarn et al. | |
| 5,807,509 A | 9/1998 | Shrier et al. | |
| 5,869,869 A | 2/1999 | Hively | |
| 5,889,308 A | 3/1999 | Hong et al. | |
| 5,938,050 A | 8/1999 | Roesner | |
| 5,955,762 A | 9/1999 | Hively | |
| 5,958,537 A | 9/1999 | Akhter | |
| 5,970,321 A | 10/1999 | Hively | |
| 5,973,588 A | 10/1999 | Cowman et al. | |
| 5,974,661 A | 11/1999 | Neuhalfen | |
| 6,000,042 A | 12/1999 | Henrie | |
| 6,018,299 A | 1/2000 | Eberhardt | |
| 6,023,028 A | 2/2000 | Neuhalfen | |
| 6,037,045 A * | 3/2000 | Fukaya | 428/210 |
| 6,087,923 A | 7/2000 | Ahn et al. | |
| 6,094,128 A * | 7/2000 | Bennett et al. | 338/21 |
| 6,097,066 A | 8/2000 | Lee et al. | |
| 6,108,184 A | 8/2000 | Minervini et al. | |
| 6,172,590 B1 * | 1/2001 | Shrier et al. | 338/20 |
| 6,191,928 B1 | 2/2001 | Rector et al. | |
| 6,211,554 B1 | 4/2001 | Whitney | |
| 6,239,687 B1 * | 5/2001 | Shrier et al. | 338/21 |
| 6,251,513 B1 | 6/2001 | Rector et al. | |
| 6,445,280 B1 * | 9/2002 | Javadi | 338/214 |
| 2002/0075129 A1 * | 6/2002 | Mizoguchi et al. | 338/25 |

FOREIGN PATENT DOCUMENTS

| | | |
|---|---|---|
| DE | 3530354 | 3/1987 |
| DE | 3728489 | 3/1989 |
| EP | 0270954 | 6/1988 |
| EP | 0301533 | 2/1989 |
| EP | 0453217 | 10/1991 |
| EP | 581428 | 2/1994 |
| EP | 625808 | 11/1994 |
| GB | 1477572 | 6/1977 |
| GB | 1604820 | 12/1981 |
| GB | 2089148 | 6/1982 |
| JP | 6283301 | 10/1974 |
| JP | 4033230 | 2/1992 |
| JP | 4242036 | 8/1992 |
| JP | 4245129 | 9/1992 |
| JP | 4245132 | 9/1992 |
| JP | 4248221 | 9/1992 |
| JP | 4255627 | 9/1992 |
| JP | 5166454 | 7/1993 |
| JP | 5314888 | 11/1993 |
| JP | 6103880 | 4/1994 |
| WO | 83/01153 | 3/1983 |
| WO | 91/14279 | 9/1991 |
| WO | 97/21230 | 6/1997 |
| WO | 90/00305 | 1/1998 |
| WO | 99/46819 | 9/1999 |
| WO | 99/46820 | 9/1999 |

* cited by examiner

ELECTROSTATIC DISCHARGE MULTIFUNCTION RESISTOR

PRIORITY CLAIM

This application claims the benefit of Provisional U.S. Patent Application No. 60/304,244, filed Jul. 10, 2001, entitled "Electrostatic Discharge Suppression Termination Resistor".

BACKGROUND OF THE INVENTION

The present invention relates to termination resistors. More particularly, the present invention relates to an improved voltage variable material ("VVM") that is employed additionally as a termination resistor.

Electrical overstress transients ("EOS transients") produce high electric fields and high peak powers that can render circuits, or the highly sensitive electrical components in the circuits, temporarily or permanently non-functional. EOS transients can include transient voltages or current conditions capable of interrupting circuit operation or destroying the circuit outright. EOS transients may arise, for example, from an electromagnetic pulse, an electrostatic discharge, e.g., from a device or a human body, lightning, a build up of static electricity or be induced by the operation of other electronic or electrical components. An EOS transient can rise to its maximum amplitude in subnanosecond to microsecond times and have repeating amplitude peaks.

The peak amplitude of the electrostatic discharge ("ESD") transient wave may exceed 25,000 volts with currents of more than 100 amperes. There exist several standards which define the waveform of the EOS transient. These include IEC 61000-4-2, ANSI guidelines on ESD (ANSI C63.16), DO-160, and FAA-20-136. There also exist military standards, such as MIL STD 883 part 3015.

Materials exist for the protection against EOS transients ("EOS materials"), which are designed to rapidly respond (i.e., ideally before the transient wave reaches its peak) to reduce the transmitted voltage to a much lower value and clamp the voltage at the lower value for the duration of the EOS transient. EOS materials are characterized by having high electrical impedance values at low or normal operating voltages. In response to an EOS transient, the materials switch essentially instantaneously to a low electrical impedance state. When the EOS threat has been mitigated these materials return to their high impedance state. These materials are capable of repeated switching between the high and low impedance states, allowing circuit protection against multiple EOS events.

EOS materials also recover essentially instantaneously to their original high impedance value upon termination of the EOS transient. EOS materials can switch to the low impedance state thousands of times, withstanding thousands of ESD events, and recover to the high impedance state after providing protection from each of the individual ESD events.

Circuit components utilizing EOS materials can shunt a portion of the excessive voltage or current due to the EOS transient to ground, protecting the electrical circuit and its components. The major portion of the threat transient, however, is reflected back towards the source of the threat. The reflected wave is either attenuated by the source, radiated away, or re-directed back to the surge protection device which responds to each return pulse until the threat energy is reduced to safe levels.

One voltage variable material or composition for providing protection against electrical overstress is disclosed in U.S. Pat. No. 6,251,513 B1, entitled, "Polymer Composites for Overvoltage Protection", assigned to the assignee of this invention, the teachings of which are incorporated herein by reference. Other voltage variable materials, the teachings of which are incorporated herein by reference, include the following.

U.S. Pat. No. 2,273,704, issued to Grisdale, discloses granular composites which exhibit non-linear current/voltage relationships. These mixtures are comprised of conductive and semiconductive granules that are coated with a thin insulative layer and are compressed and bonded together to provide a coherent body.

U.S. Pat. No. 2,796,505, issued to Bocciarelli, discloses a non-linear voltage regulating element. The element is comprised of conductor particles having insulative oxide surface coatings that are bound in a matrix. The particles are irregular in shape and make point contact with one another.

U.S. Pat. No. 4,726,991 issued to Hyatt et al., discloses an EOS protection material comprised of a mixture of conductive and semiconductive particles, all of whose surfaces are coated with an insulative oxide film. These particles are bound together in an insulative binder. The coated particles are preferably in point contact with each other and conduct preferentially in a quantum mechanical tunneling mode.

U.S. Pat. No. 5,476,714, issued to Hyatt, discloses EOS composite materials comprised of mixtures of conductive and semiconductive particles sized to be in a 10 to 100 micron range. The materials also include a proportion of insulative particles. All of these materials are bonded together in an insulative binder. This invention includes a grading of particle sizes such that the composition causes the particles to take a preferential relationship to each other.

U.S. Pat. No. 5,260,848, issued to Childers, discloses foldback switching materials which provide protection from transient overvoltages. These materials are comprised of mixtures of conductive particles in the 10 to 200 micron range. Semiconductor and insulative particles are also employed in these compositions. The spacing between conductive particles is at least 1000 angstroms.

Additional EOS polymer composite materials are also disclosed in U.S. Pat. Nos. 4,331,948, 4,726,991, 4,977,357, 4,992,333, 5,142,263, 5,189,387, 5,294,374, 5,476,714, 5,669,381 and 5,781,395, the teachings of which are specifically incorporated herein by reference.

Data communication circuits often require the use of resistors to perform termination, impedance matching, pull-up or pull-down functions. These techniques are well known and are applied in a wide variety of serial and parallel data bus architectures. These resistors commonly take the form of discrete components or arrays of multiple resistors which may be mounted to a printed circuit board ("PCB"), wherein the PCB also holds data transmission receiver and transmitter circuitry. It is this circuitry that is often the most vulnerable to the damaging effects of ESD, since it is connected to the outside environment by a bus or metallic conductors that are used for data transmission.

A common technique to protect the circuitry against ESD damage is the use of discrete ESD suppressors or arrays of multiple suppressors mounted on the PCB. The suppressors are electrically connected from the data lines to system ground or a voltage supply line. In many cases, the suppressors can be connected in parallel with the aforementioned resistors since they are themselves connected between the data lines and system ground or the voltage supply line.

One problem with connecting the suppressors in parallel with the resistors is that the resistors and suppressors consume valuable space on the PCB, which adds to system size and cost. Another problem involves the circuit board traces that interconnect termination resistors, suppressors, data lines, and system ground or supply lines. At high frequency and data rates, these traces can introduce parasitic impedance effects, which can degrade suppressor effectiveness and data signal integrity.

As mentioned earlier, the techniques associated with data line resistors are practiced in spite of the size, cost and interconnection problems. This is due to the essential nature of impedance matching, termination, and logic level pull-up and pull-down functionality in various data transmission schemes.

It would be desirable to have an apparatus and method to combine the transient suppression capability of an EOS or VVM material with the functionality of a data line resistor. This would enable one device or apparatus to perform multiple functions, reduce size and cost of the PCB and enhance performance. The range of resistances required to perform the described data line functions is generally in the range of 50 to 100,000 ohms. Until now, the high impedance of the normal state for known VVM's has been too great by orders of magnitude for this application.

SUMMARY OF THE INVENTION

The present invention provides an improved electrical overstress ("EOS") or voltage variable material ("VVM"). More specifically, the present invention provides a polymer VVM that has been formulated with a high percentage loading of conductive and/or semiconductive particles. The conductivity of this VVM is in the range of 10 to 100 ohms per a selected application area. The exact resistance for an application of this material is therefore determined by the area of material applied. A known length and width of the material is placed between adjacent electrodes to produce a desired resistance. One application for this "resistor" is the termination of a transmission line to prevent unwanted reflections and distortion of high frequency signals. In an embodiment, the transmission line is a printed circuit board trace. This resistor behaves according to Ohm's Law at normal circuit voltages, but has the ability to switch to a drastically lower resistance when exposed to an ESD transient or event.

To this end, in one embodiment of the present invention, a resistor providing protection against an electrical overstress event is provided. The resistor includes an insulating binder. Conductive particles having a volume percentage range of 20 to 72% are mixed with the insulating binder. A quantity of the conductive particles and the binder is then deposited in a specific geometric size to achieve a desired resistance.

In an embodiment, the conductive particles include a material selected from the group consisting of: nickel, carbon black, aluminum, silver, gold, copper and graphite, zinc, iron, stainless steel, tin, brass, and alloys thereof, and conducting organic materials, such as intrinsically conducting polymers.

In an embodiment, the conductive particles have a bulk conductivity greater than $1\times10$ (ohm-cm)$^{-1}$.

In an embodiment, the insulating binder includes a material selected from the group consisting of: thermoset polymers, thermoplastic polymers, elastomers, rubbers and polymer blends.

In an embodiment, the insulating binder includes a silicone resin.

In an embodiment, semiconductive particles are mixed with the binder and the conductive particles.

In an embodiment, the semi-conductive particles include silicon carbide.

In an embodiment, the semi-conductive particles have a bulk conductivity in a range of 10 to $1\times10^{-6}$ (ohm-cm)$^{-1}$.

In an embodiment, insulating particles are mixed with the binder and the conductive particles.

In an embodiment, the binder and the conductive particles are enclosed in a discrete housing.

In an embodiment, the housing is surface mountable to a printed circuit board.

In an embodiment, the resistor is a pull-up/pull-down resistor.

In another embodiment of the present invention, a data line resistor and electrical overstress ("EOS") protection device for a transmission line is provided. The device includes a pair of electrodes. A resistor composed of a voltage variable material ("VVM") electrically couples to the electrodes. The voltage variable material of the resistor is applied in a quantity that provides a desired resistance.

In an embodiment, the voltage variable material includes an insulating binder and conductive particles mixed with the insulating binder, the particles having a volume percentage range of 20 to 72%.

In an embodiment, the semiconductive particles mixed with the binder and the conductive particles are enclosed in a housing.

In an embodiment, the housing is surface mountable to a printed circuit board.

In an embodiment, the VVM resistor electrically communicates with a ground contact.

In an embodiment, the data line resistor and EOS protection device includes a capacitor that electrically communicates with the VVM resistor and a ground contact.

In an embodiment, the data line resistor and EOS protection device includes a plurality of VVM resistors that each electrically communicate with a separate pair of electrodes. In an embodiment, one electrode of each pair of electrodes couples to a unique transmission line.

In an embodiment, the data line resistor and EOS protection device includes at least one capacitor that electrically communicates with the VVM resistors.

In an embodiment, the data line resistor and EOS protection device includes a plurality of VVM resistors that electrically communicate with a plurality of ground contacts.

In an embodiment, the binder mixed with the conductive particles is enclosed in a housing.

In an embodiment, the housing is surface mountable to a printed circuit board located inside the connector.

In yet another embodiment of the present invention, a resistor providing protection against an electrical overstress is provided. The resistor includes a printed circuit board ("PCB"). A pair of pads are etched onto the PCB. A resistor electrically connects to the pads. A quantity of voltage variable material is applied to electrical connections between the resistor and the pads.

It is therefore an advantage of the present invention to provide a VVM material as a resistor.

Another advantage of the present invention is to provide a VVM material as a termination device for data transmission lines.

A further advantage of the present invention is to provide a VVM material as a "pull up" or "pull down" resistor in a data or signal line.

Yet another advantage of the present invention is to provide a VVM resistor that can be directly applied to a printed circuit board or other type of circuit substrate.

Yet a further advantage of the present invention is to provide a VVM resistor in a surface mountable device.

Moreover, it is an advantage of the present invention to provide a multiple function electrical device that takes up less PCB space.

Additionally, it is an advantage of the present invention to provide a multiple function electrical device that improves system performance.

Additional features and advantages of the present invention will be described in, and apparent from, the following Detailed Description of the Preferred Embodiments and the Drawings.

DETAILED DESCRIPTION OF THE INVENTION

Figure 1A:
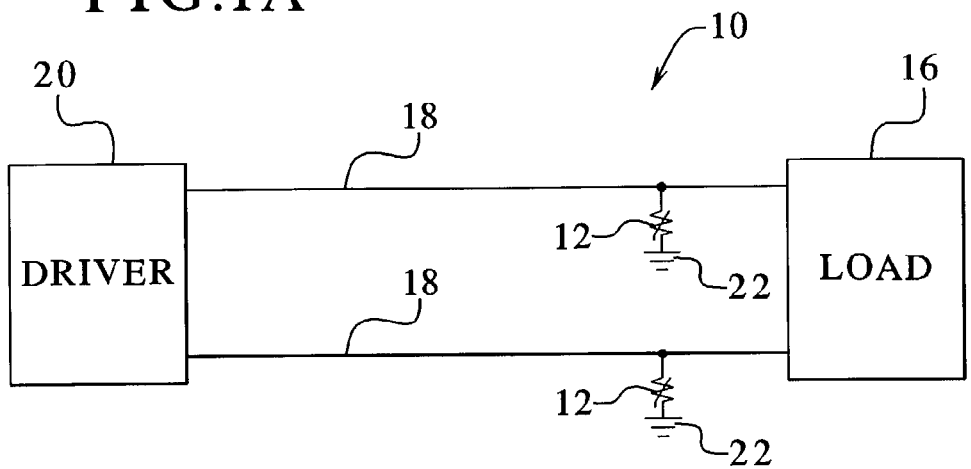
FIGS. 1A through 1C are schematic electrical diagrams of data network circuits employing known termination resistor techniques.
Figure 1B:
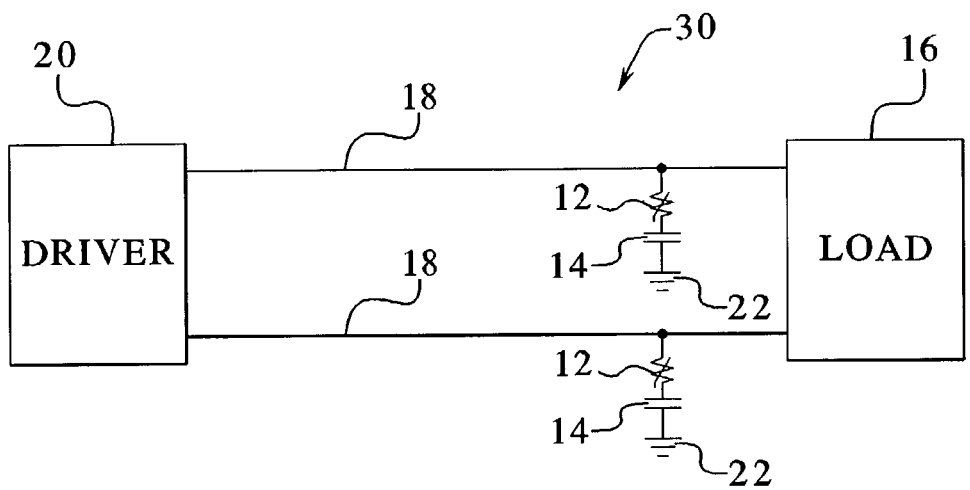
Figure 1C:
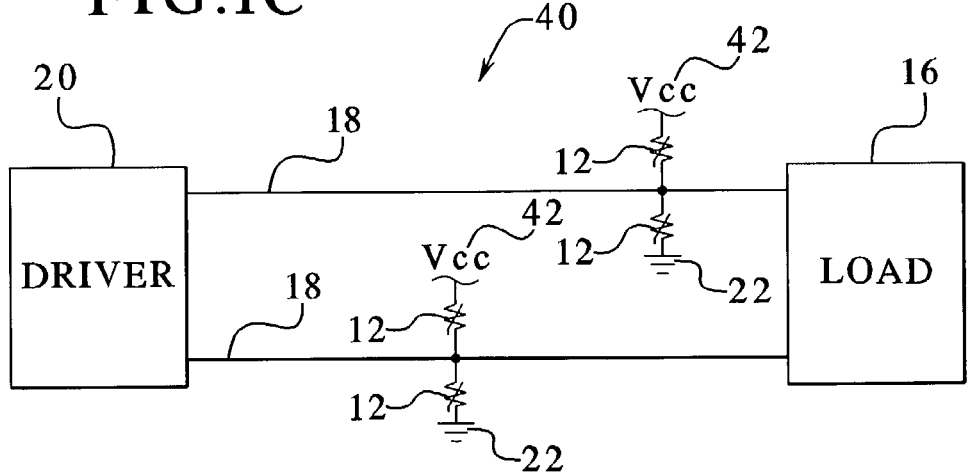

Referring now to the drawings and in particular to FIGS. 1A through 1C, schematic diagrams of three commonly used data transmission termination techniques and employing a voltage variable material ("VVM") resistor 12 (symbol illustrated is a combination of the resistor symbol plus a circuit protection device symbol) of the present invention are illustrated. In FIG. 1A, a data network circuit 10 includes a driver 20, which can be a variety of known digital data driver integrated circuits. The circuit 10 also includes a load 16, which is any type of data input circuit.

Transmission lines 18 that couple the driver 20 to the load 16 may each consist of a single conductor referenced to ground, differential pairs, or multiple single conductors each referenced to ground. The conductors are conductive, i.e., are metallic and in an embodiment are configured as circuit board traces. Alternatively, transmission lines 18 are single or multiple conductor cables, twisted pair cables, coaxial cables or any combination thereof.

As shown in the circuit 10 of FIG. 1A, a single VVM resistor 12 is applied to each data transmission line 18. The nominal resistance of the VVM resistor 12 is normally chosen to match the characteristic impedance of the respective transmission line 18 to minimize signal reflection due to an impedance mismatch. During an ESD event, the VVM resistors 12 switch to low resistance values and provide high conductance paths to respective circuit grounds 22. After the ESD event, the VVM resistors 12 return to their nominal resistance values. It should be appreciated that the VVM resistors 12 of the circuit 10 perform multiple functions, i.e., impedance matching and providing ESD protection.

FIG. 1B shows a circuit 30 employing the VVM resistor 12 in series combination with a capacitor 14 to form an AC termination network. Typically, the nominal resistance of the VVM resistor 12 is equal to the characteristic impedance of its respective data transmission line 18. The methodology of selecting a capacitance value for the capacitor 14 is known to those of skill in the art, and as is chosen to minimize waveform distortion and power consumption. During an ESD event, the VVM resistors 12 of the circuit 30 switch to a low impedance state. In this state, the series combination of each resistor 12 and capacitor 14 constitutes a highly conductive path to ground during the fast rise, short duration ESD event. Again, the VVM resistors 12 of the circuit 30 perform the dual functions of impedance matching and providing circuit protection.

FIG. 1C shows a circuit 40 employing the VVM resistors 12 in a common Thevenin, or dual termination scheme, which requires two resistors for each line. The parallel combination of the resistors matches the characteristic impedance of the respective data transmission line 18. The advantages of Thevenin termination is that the resistors also serve as pull-up and pull-down resistors. It should be noted that Vcc 42, the system voltage supply line, is in effect at system ground potential for high frequency signals and fast rise, short duration ESD events. Therefore, in one embodiment employing Thevenin termination, both resistors are VVM resistors 12, wherein two paths to ground exist (one to circuit ground 22 and one to Vcc 42) for the ESD energy. Alternatively, one of the two resistors is a conventional resistor with a fixed resistance, while the other resistor is the VVM resistor 12, in which case there is one preferred path to ground for ESD energy. In this latter embodiment, the fixed resistor (not illustrated) is preferably connected between the transmission line 18 and Vcc 42, while the VVM resistor 12 is connected between the transmission line 18 and ground 22.

Figure 2:
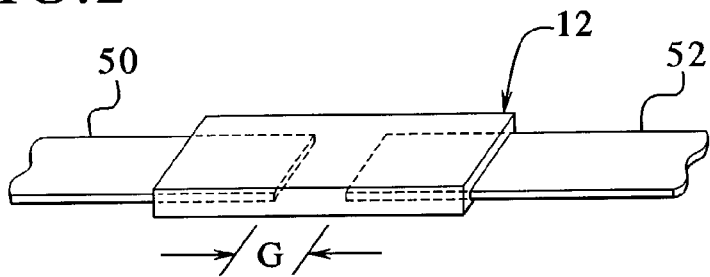
FIG. 2 is a schematic illustration of one embodiment of the voltage variable resistor of the present invention.

Referring now to FIG. 2, one embodiment of the VVM resistor 12 of the present invention is illustrated. Once the desired nominal resistance is known, the length and width of the application area for the VVM resistor 12 can be determined. The VVM of the present invention has a known and desired resistivity as described in more detail below. The desired nominal resistance is the resistance that will match the impedance of the transmission scheme. The desired nominal resistance divided by the resistivity of the VVM provides the necessary length of application, i.e., the distance of the gap G between electrodes 50 and 52. The resistor 12 can therefore be provided in different sizes to cover different sized gaps depending on the characteristic impedance value of the data transmission scheme.

The present invention contemplates: (i) directly coupling the VVM resistor 12 by laying and trimming, if necessary a layer of VVM having a known resistivity across the gap "G" between electrodes 50 and 52 on a PCB, polyimide, polymer, flex circuit, any combination of these or other type of substrate or (ii) packaging the VVM material in a housing. One apparatus and method for directly coupling the VVM resistor 12 to the substrate is set forth in U.S. Provisional Patent application No. 60/370,975, entitled "Voltage Variable Material for Direct Application and Devices Employing Same", assigned to the assignee of the present invention. This VVM intrinsically adheres to surfaces, such as a conductive, metal surface or a non-conductive, insulative surface or substrate, and cures without additional processing. Devices employing this VVM can be cured however to speed the manufacturing process of same. The binder disclosed in the provisional application can be used in combination with the VVM formulation set forth below to produce a directly applying, self-curable VVM resistance material for the resistor 12. The resistance material does not require a device housing but can otherwise have a protective encapsulant, such as an epoxy.

The self-curing and self-adhering insulative binder of the VVM disclosed in Provisional Patent application No. 60/370,975 includes a polymer or thermoplastic resin, such as polyester, which is dissolved in a solvent. The polyester resin has a glass transition temperature in the range of 6° C. to 80° C. and a molecular weight between 15,000 and 23,000 atomic mass units ("AMU's"). One suitable solvent for dissolving the polymer is diethylene glycol monoethyl ether acetate, commonly referred to as "carbitol acetatate". In an embodiment, a thickening agent is added to the insulative binder, which increases the viscosity of the insulative binder. For example, the thickening agent can be a fumed silica, such as that found under the tradename Cab-o-Sil TS-720.

The insulative binder of the present invention has a high dielectric breakdown strength, a high electrical resistivity and high tracking impedance. The insulative binder provides and maintains sufficient interparticle spacing between the other possible components of VVM 100, such as conductive particles, insulating particles, semiconductive particles, doped semiconductive particles and various combinations of these. The interparticle spacing, the resistivity and dielectric strength of the insulative binder each affect the high impedance quality of the VVM in its normal state. In an embodiment, the insulative binder has a volume resistivity of at least $10^9$ ohm-cm. It is possible to blend different polymers in the binder and to cross-link same.

Likewise, one device or housing for enclosing a quantity of VVM material is disclosed in U.S. Pat. No. 6,191,928 B1, entitled Surface-Mountable Device for Protection Against Electrostatic Damage to Electronic Components, assigned to the assignee of this invention, the teachings of which are incorporated herein by reference. The referenced patent involves a VVM having a very high normal impedance, which is not applied in a specific quantity to provide a desired Ohmic resistance. The housing of the present invention may have different sizes to house different sized quantities of VVM so as to provide a desired resistance, e.g., between 50–100,000 ohms.

Figure 3:
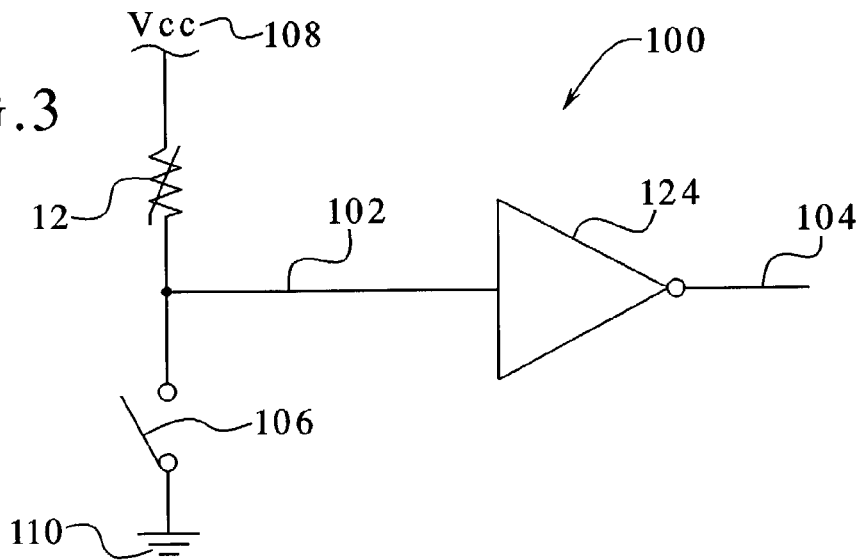
FIG. 3 is a circuit diagram illustrating a VVM resistor in a pull-up resistor application.

Referring now to the high impedance gate 100 of FIG. 3, as described above another application of the present invention is to employ the VVM resistor 12 of the present invention as a pull-up or pull-down resistor. Pull-up resistors are well known in the art and are normally used to insure that given no other input, a circuit assumes a default value, such as the system supply voltage or Vcc 108. That is, pull-up circuits prevent input lines from floating. The VVM resistor in the circuit 100 prevents too much current from flowing through the circuit. The resistor 12 may be employed as either a pull-up resistor or a pull-down resistor. Their function is the same, to create a default value for a circuit, but one pulls a line high, the other pulls it low, usually to system ground.

In FIG. 3, high impedance gate 100 has an input 102 and an output 104. The high impedance input state of gate 100 means it provides no real power of its own. If nothing is connected to input 102, the value of the input is considered to be floating (most gates will float towards a high state), wherein any electrical noise could cause input 102 to switch (e.g., go low). When a switch 106 is closed (on), the input state at input 102 is stable, since there is a definite connection to an electrical potential. When switch 106 open (off), input 102 is susceptible to a wide array of electrical problems if the VVM resistor 12 in the pull-up arrangement to Vcc 108 (+5 volts) does not exist. The traces or wires connected to input 102 may allow enough electrical noise in (by acting as little antennas) to cause device 124 to incorrectly switch states.

The pull-up VVM resistor 12 enables the input 102 to keep a steady state by connecting to an electrical potential, i.e., Vcc 108, when switch 106 is open. Since input 102 is a high impedance input, it shows Vcc (+5v) when switch 106 is open. When switch 106 is closed (on), input 102 has a direct connection to ground 110. The input 102 side of VVM resistor 12 also has a direct connection to ground when the switch 106 is closed, so that current flows from Vcc 108, through resistor 12, to ground. Resistor 12 is sized appropriately, e.g., 100 to 100,000 ohms, to limit the amount of current and prevent a short circuit.

The well known (but less used) alternative pull-down resistor (not illustrated) essentially involves reversing the relative positions of the VVM resistor 12 and the switch 106 as they are illustrated in FIG. 3. Just like the pull-up resistor embodiment, a VVM resistor 12 in the pull-down arrangement limits the current that can flow between Vcc 108 and ground 110. Though less often used, it is still a valid application for the VVM resistor 12. Further, although not illustrated, the VVM resistor 12 of the present invention may be employed as a well known current limiting resistor or in any other known application for a resistor.

Figure 4:
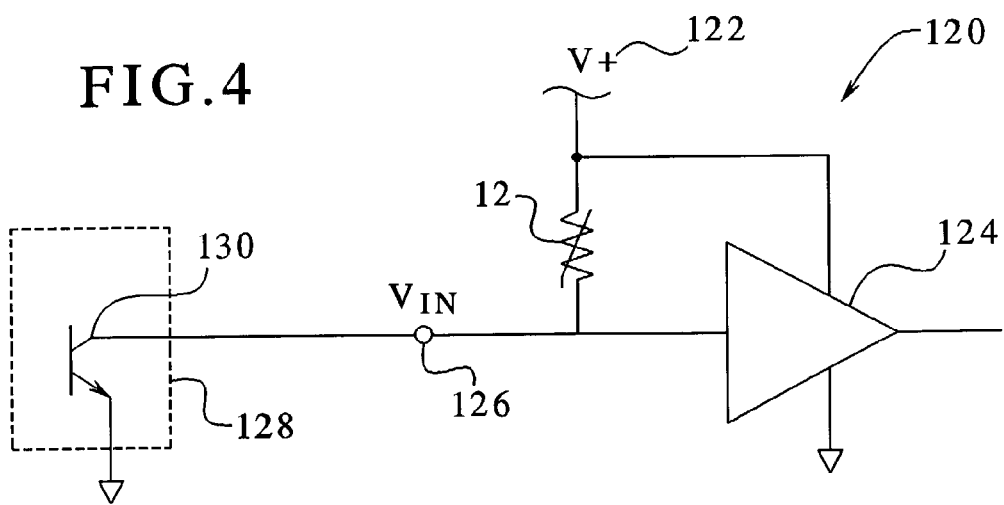
FIG. 4 is an alternative circuit diagram illustrating a VVM resistor in a pull-up resistor application.

An alternative pull-up arrangement is illustrated by the circuit 120 in FIG. 4, wherein the VVM resistor 12 establishes a voltage V+122 as the input for the device 124, regardless of the voltage Vin 126. The device 128 includes an open collector output transistor 130. When the transistor 130 is open, the input line is pulled up to Vin 126 so that Vin=V+. When transistor 130 is closed, the input line is pulled down to ground so that Vin=0.

Many digital circuits use a 10kΩ or a 47kΩ resistor for pull-ups (and pull-downs). The exact value does not actually matter, as long as the resistance of the VVM resistor is high enough to prevent too much current from flowing. 10kΩ is likely the most common value, however, the 47kΩ resistor saves more power. Higher values for the VVM resistor 12 are possible depending on the characteristics of the chip.

As before, the pull-up VVM resistor 12 may also be applied directly, e.g., to a PCB or to another suitable substrate, such as a polymide or other polymer, as set forth in U.S. Provisional Patent application No. 60/370,975. The VVM resistor 12 in a pull-up or pull-down arrangement may further be implemented in a housing or device, which is soldered or otherwise electrically bound to a suitable substrate.

The VVM resistor includes an EOS switching material that uses conductive particles in an insulating binder via standard mixing techniques. In an embodiment, semiconductive particles and/or insulating particles may be added to the mixture. The insulating binder is chosen to have a high dielectric breakdown strength, a high electrical resistivity and high tracking resistance. The switching characteristics of the composite material are determined by the nature of the conductive, semiconductive, and insulative particles, the particle size and size distribution, and the interparticle spacing.

The interparticle spacing depends upon the percent loading of the conductive, semiconductive, and insulative particles and on their size and size distribution. In an embodiment, interparticle spacing is greater than 100 angstroms or 500 angstroms. Additionally, the insulating binder provides and maintains sufficient interparticle spacing between the conductive and semiconductive particles to provide a desired normal state resistance. The desired normal state resistance is also effected by the resistivity and dielectic strength of the insulating binder. The insulating binder material in an embodiment, has a volume conductivity of at most $1 \times 10^{-6}$ (ohm-cm)$^{-1}$.

Suitable insulative binders for the VVM include thermoset polymers, thermoplastic polymers, elastomers, rubbers, or polymer blends. The polymers may be cross-linked to promote material strength. Likewise, elastomers may be vulcanized to increase material strength. In an embodiment, the insulative binder comprises a silicone rubber resin manufactured by, for example, Dow Corning STI and marketed under the tradename Q4-2901. This silicone resin is cross-linked with a peroxide curing agent; for example, 2,5-bis-(t-butylperoxy)-2,5-dimethyl-1-3-hexyne, available from, for example, Aldrich Chemical.

The choice of the peroxide curing agent is partially based on desired cure times and temperatures. Many binders may be employed, however, as long as the material does not preferentially track in the presence of high interparticle current densities. In another embodiment, the insulative binder comprises silicone resin and is manufactured by, for example, General Electric and marketed under the tradename SLA7401-D1. Another binder that is self-curable and suitable for direct application to a substrate is discussed above and disclosed in Provisional U.S. Patent Application No. 60/370,975.

In an embodiment, the conductive particles have bulk conductivities greater than $1 \times 10$ (ohm-cm)$^{-1}$. In an embodiment, the conductive particles have an average particle size of less than 1000 microns. In an embodiment, 95% of the conductive particles have diameters no larger than 20 microns. In another embodiment, the particles are less than 10 microns in diameter.

Conductive materials that are suitable for use in the present invention include nickel, copper, aluminum, carbon black, graphite, silver, gold, zinc, iron, stainless steel, tin, brass, and metal alloys. In another embodiment, conducting polymer powders, such as doped polypyrrole or polyaniline may also be employed, as long as they exhibit stable electrical properties. In an embodiment, the conductive particles are nickel manufactured by for example, Atlantic Equipment Engineering, and marketed under the tradename Ni-120 and have an average particle size in the range of 10–30 microns. In another embodiment, the conductive particles comprise aluminum and have an average particle size in the range of 1–5 microns.

The semiconductive particles contemplated for use in the present invention have an average particle size less than 100 microns. In an embodiment, the bulk conductivity of the semiconductor particles is in the range of 10 to $1 \times 10^{-6}$ (ohm-cm)$^{-1}$. However, in order to enhance particle packing density and obtain optimum clamping voltages and switching characteristics, the average particle size of the semiconductive particles in an embodiment is in a range of about 3 to about 5 microns, or even less than 1 micron. Semiconductive particle sizes down to the 100 nanometer range and less are also suitable for use in the present invention.

One suitable semiconductive material is silicon carbide. The semiconductive materials, however, alternatively include: oxides of bismuth, copper, zinc, calcium, vanadium, iron, magnesium, calcium and titanium; carbides of silicon, aluminum, chromium, titanium, molybdenum, beryllium, boron, tungsten and vanadium; sulfides of cadmium, zinc, lead, molybdenum, and silver; nitrides such as boron nitride, silicon nitride and aluminum nitride; barium titanate and iron titanate; suicides of molybdenum and chromium; and borides of chromium, molybdenum, niobium and tungsten.

In an embodiment, the semiconductive particles are silicon carbide manufactured by for example, Agsco, #1200 grit, having an average particle size of approximately 3 microns, or silicon carbide manufactured by for example, Norton, #10,000 grit, having an average particle size of approximately 0.3 microns. In another embodiment, the compositions of the present invention include semiconductive particles formed from mixtures of different semiconductive materials; e.g., silicon carbide and at least one of the following materials: barium titanate, magnesium oxide, zinc oxide, and boron nitride.

In the VVM of the VVM resistor 12 of the present invention, the insulating binder is in a proportion of about 5 to about 70% by volume of the total composition. The conductive particles may comprise from about 10 to about 70% by volume of the total composition. The semiconductive particles may comprise from about 2 to about 70% by volume of the total composition.

According to another embodiment of the present invention, the VVM further includes insulative particles having a bulk conductivity of about $1 \times 10^{-6}$ (ohm-cm)$^{-1}$. An example of a suitable insulating particle is titanium dioxide having an average particle size from about 300 to about 400 angstroms produced by, for example, Nanophase Technologies. Other examples of suitable insulating particles include, oxides of iron, aluminum, zinc, titanium and copper and clay such as montmorillonite type produced by, for example, Nanocor, Inc. and marketed under the Nanomer tradename. The insulating particles, if employed in the composition, are in an embodiment present in an amount from about 1 to about 15%, by volume of the total composition.

Through the use of a suitable insulating binder and conductive particles, semiconductive particles and possibly insulating particles, having the preferred particle sizes and volume percentages, compositions of the present invention generally can be tailored to provide a range of clamping voltages from about 30 volts to greater than 2,000 volts. Further, combining proper concentrations of a suitable insulating binder, conductive particles, semi-conductive particles and possibly insulating particles, compositions of the present invention can be tailored to provide a range of useful resistivities for the VVM resistor of the present invention. In an embodiment, the VVM of the resistor 12 includes only conductive particles or conductive particles having an insulative coating mixed into an insulative binder.

Figure 5:
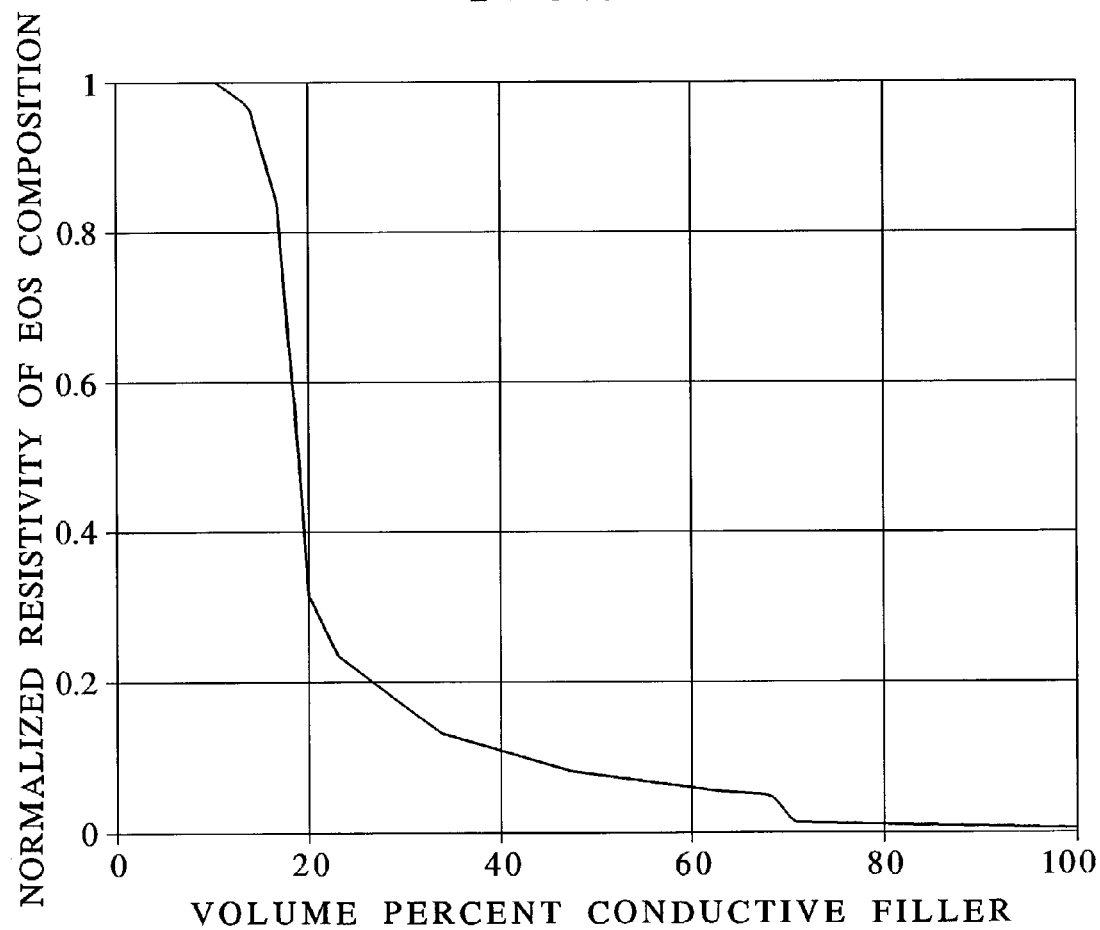
FIG. 5 is a percolation curve of normalized normal state resistivity versus conductive filler concentration for a typical EOS material.

Referring now to FIG. 5, a percolation curve plots a normalized resistivity of the VVM material when no EOS transient is present as a function of the percentage by volume of a suitable conductive filler. For purposes of illustration, the conductive filler may be assumed to be any of the conductive particles having one of the sizes disclosed above. The vertical axis shows normalized resistivity with wherein the value "one" represents the resistivity of the insulative binder, and the value "zero" represents the resistivity of the bulk filler. It should be noted that the percolation curve for the system could be shown in terms of absolute resistivity, in which case the vertical axis would span several orders of magnitude.

The concentration of conductive filler needed to significantly change the normal state resistance typically ranges from about 15 to 20% by volume, depending on the nature of the other ingredients present in the formulation. In a typical application requiring a very high resistivity, a conductive fill concentration of less than 20% typically provides a very high resistance, which may change very rapidly. As the concentration increases from 20% to 60% or 70%, the curve flattens significantly. An EOS material having 40% to 60% or 72% by volume conductive filler therefore produces a material having a discernable and repeatable resistivity.

By selecting and manufacturing a concentration in this range, a VVM resistor of a known and repeatable resistivity can be made. Moreover, VVM resistors having resistivities commonly used in known termination resistors, pull-up/pull-down resistors and current limiting resistors can be made. Of course, the overall resistance provided by the material is also a function of the amount used. A VVM resistor having a known and repeatable resistance can therefore be made by supplying a known quantity of a material of known resistivity. It should be appreciated then that knowing: (i) the desired resistance for the VVM resistor and (ii) the desired amount or the available space for application of the VVM resistor, a particular resistivity can be calculated and a particular conductive filler concentration can be extrapolated.

As observed in FIG. 5, a dip in resistivity occurs when the concentration of the conductive filler reaches approximately 65 to 72%. It is within this range when complete contact of the conductive metal spheres occurs. The dip in resistivity levels off at the bulk resistivity of the conductive filler. After reaching the complete contact concentration, the resistivity is essentially the resistivity of bulk metal, e.g., bulk nickel. The bulk metal resistivity is on the order of $1 \times 10^{-6}$ (ohm-cm)$^{-1}$, which is likely to be too low for most applications. For this reason, the upper end of the conductive filler concentration for the VVM resistor is preferably at or before the bulk metal dip, i.e., 65 to 72%. The particle size for the conductive component is one important factor in determining where, within the 65 to 72% range, the dip will occur.

Figure 6A:
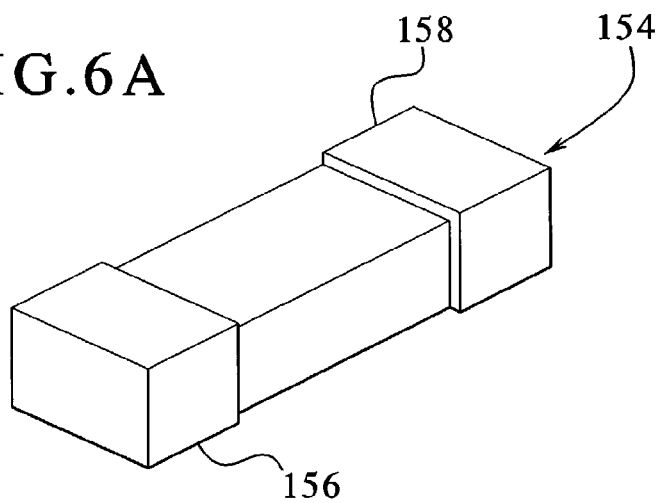
FIGS. 6A through 6C illustrate an alternative VVM resistor of the present invention, which employs a VVM material having a high resistivity in its normal state.
Figure 6B:
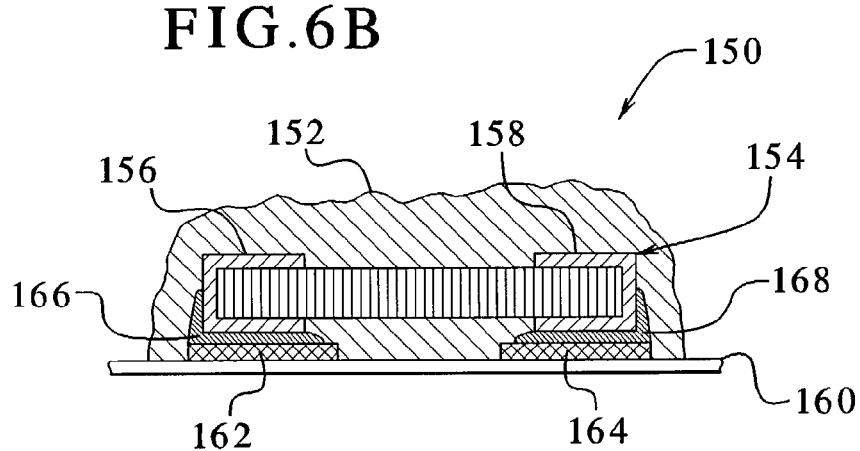
Figure 6C:
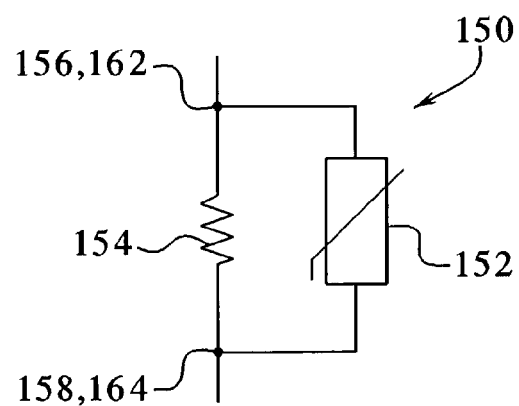

Referring now to FIGS. 6A to 6C, an alternative application using known voltage variable materials, i.e., high resistance materials, is illustrated. That is, the VVM resistors 12 (FIGS. 1A to 1C, 2, 3 and 4) as heretofore described employ a VVM having a higher conductivity, i.e., having a lower resistivity when no EOS transient is present than in known applications of VVM. The VVM 152 of the alternative VVM resistor 150 illustrated in FIG. 6B, however, employs the VVM material, which is highly resistive upon the occurrence of an EOS transient, e.g., as disclosed in U.S. Pat. No. 6,251,513 B1, which has been incorporated by herein reference above.

FIG. 6A illustrates a known surface mount resistor 154, which is soldered to a PCB 160 or other type of substrate, such as a flex-circuit or polymide (referred to herein as PCB 160 for ease of illustration), via electrodes 156 and 158 as is well known in the art. The resistor 154 includes a material having a fixed resistivity. FIG. 6B illustrates a sectioned view of the alternative VVM resistor 150. A PCB 160 has a plurality of conductive, e.g., etched, mounting pads 162 and 164. The electrodes 156 and 158 of the fixed resistor 154 are electrically coupled to the pads 162 and 164, respectively, via solder fillets 166 and 168. A layer of VVM 152 having a high resistance when no EOS transient is present is applied over the assembly to form the VVM resistor 150. Normally, current flows through the resistor 154, not the VVM 152. During an ESD event, the layer of VVM 152 creates a highly conductive path from the pad 162 to the pad 164. As described above, the VVM material 152 may be directly applied to the PCB 160 or the alternative VVM resistor 150 may be housed in a body (not illustrated), which solders to PCB 160 or other substrate.

Referring now to FIG. 6C, an equivalent circuit for the alternative VVM resistor 150 is illustrated. When no EOS transient is present, no current or little current flows through high resistivity VVM material 152 and the fixed resistor 154 performs its Ohmic function. As disclosed above, fixed resistor 154 may be a termination resistor, a pull-up or pull-down resistor, a current limiting resistor or be employed in any resistor application. When an ESD event occurs, the VVM material switches to a low resistivity, high conductivity state, so that the EOS transient may dissipate. As illustrated, the alternative VVM resistor 150 places the VVM material 152 in parallel with the fixed resistor 154.

It should be understood that various changes and modifications to the presently preferred embodiments described herein will be apparent to those skilled in the art. Such changes and modifications may be made without departing from the spirit and scope of the present invention and without diminishing its attendant advantages.

The invention claimed is:

1. A multifunction resistor comprising:
   an insulating binder; and
   conductive particles mixed with the insulating binder having a volume percentage of at least 15% of a total composition of the resistor, wherein the conductive particles and insulative binder are provided in a quantity that in an Ohmic state yields a resistance of between 50 and 100,000 Ohms when an electrostatic discharge event is not present, and in a non-Ohmic state non-Ohmically lowers resistivity when the electrostatic discharge event is present.

2. The resistor of claim 1, which includes semiconductive particles mixed with the binder and the conductive particles.

3. The resistor of claim 2, wherein the semi-conductive particles include silicon carbide.

4. The resistor of claim 2, wherein the semi-conductive particles have a bulk conductivity in a range of 10 to $1 \times 10^{-6}$ (ohm-cm)$^{-1}$.

5. The resistor of claim 1, wherein the conductive particles include a material selected from the group consisting of: nickel, carbon black, aluminum, silver, gold, copper and graphite, zinc, iron, stainless steel, tin, brass, and alloys thereof, and conducting organic materials, such as intrinsically conducting polymers.

6. The resistor of claim 1, which includes insulating particles mixed with the binder and the conductive particles.

7. The resistor of claim 1, wherein the conductive particles have a bulk conductivity greater than 10 (ohm-cm)$^{-1}$.

8. The resistor of claim 1, wherein the insulating binder includes a material selected from the group consisting of: thermoset polymers, thermoplastic polymers, elastomers, rubbers, and polymer blends.

9. The resistor of claim 1, wherein the insulating binder includes a silicone resin.

10. The resistor of claim 1, which includes a housing that encloses the insulative binder and the conductive particles.

11. The resistor of claim 1, wherein the insulative binder is self-curable to a substrate.

12. The resistor of claim 1, wherein the insulative binder and the conductive particles are applied directly to a substrate.

13. The resistor of claim 12, which includes an encapsulant placed on the directly applied insulative binder and particles.

14. The resistor of claim 1, which is a type of resistor selected from the group consisting of: a termination resistor and a pull-up/pull-down resistor.

15. The resistor of claim 1, which is a pull-up resistor that electrically communicates between a voltage source and an input side of a device.

16. A termination resistor for a transmission line comprising:
a pair of electrodes, one electrode coupling to the transmission line and the other electrode coupling to a ground contact; and
a quantity of voltage variable material ("VVM") coupling the pair of electrodes, the VVM (i) including conductive particles in a volume percentage of at least 15%, (ii) providing an Ohmic state yielding a desired resistance of between 50 and 100,000 Ohms and that matches substantially an impedance of the transmission line when no electrostatic discharge event is present, and (iii) providing a non-Ohmic state in which the resistivity of the VVM lowers when the electrostatic discharge event is present.

17. The resistor of claim 16, wherein the VVM further comprises:
an insulating binder; and
conductive particles mixed with the insulating binder, the particles having a volume percentage range of 20 to 72%.

18. The resistor of claim 16, which includes a housing that encloses the VVM.

19. The resistor of claim 16, wherein the insulative binder and the conductive particles are applied directly to a substrate.

20. The resistor of claim 16, which is surface mountable.

21. A multifunction resistor comprising:
a quantity of a material including conductive particles having a volume percentage of at least 15% that provides an Ohmic state having a desired resistance of between 50 and 100,000 Ohms when an electrostatic discharge event is not present, and which provides a non-Ohmic state that lowers resistivity when the electrostatic discharge event is present; and
a ground contact that electrically communicates with the quantity of material.

22. The multifunction resistor of claim 21, wherein the material is applied directly to a substrate selected from the group consisting of: a printed circuit board, a polyimide, a polymer and any combination of there.

23. A resistive device comprising:
a surface mount resistor mounted to a printed circuit board, the resistor having a plurality of electrodes connected electrically to a circuit of the printed circuit board; and
a quantity of voltage variable material ("VVM") having a 15% volume of conductive particles applied to the resistor after the resistor is mounted to the printed circuit board so that the VVM forms an electrical connection with the plurality of electrodes, wherein the VVM provides an Ohmic state having a desired Ohmic resistivity when an electrostatic discharge path is not present and a non-Ohmic state that non-Ohmically creates a low resistivity electrical path between the electrodes when the electrostatic discharge event is present.

24. The resistive device of claim 23, wherein the resistor includes a material having a fixed resistivity and the VVM electrically connects in parallel with the fixed resistivity material to the electrodes.

25. The resistive device of claim 23, wherein the VVM includes at least one component selected from the group consisting of: an insulating binder, conductive particles and semiconductive particles.

26. The resistive device of claim 23, which is a type of resistor selected from the group consisting of: a termination resistor and a pull-up/pull-down resistor.

27. The resistive device of claim 23, wherein the electrodes are electrically coupled to conductive pads on a substrate.

28. The resistive device of claim 27, wherein the VVM is applied directly to the substrate.

29. The resistive device of claim 23, wherein the VVM is applied directly to the electrodes.

* * * * *